(12) United States Patent
Priewasser

(10) Patent No.: US 10,784,164 B2
(45) Date of Patent: Sep. 22, 2020

(54) METHOD OF DIVIDING WAFER

(71) Applicant: DISCO CORPORATION, Tokyo (JP)

(72) Inventor: Karl Heinz Priewasser, Munich (DE)

(73) Assignee: DISCO CORPORATION, Tokyo (JP)

( * ) Notice: Subject to any disclaimer, the term of this patent is extended or adjusted under 35 U.S.C. 154(b) by 0 days.

(21) Appl. No.: 15/064,209

(22) Filed: Mar. 8, 2016

(65) Prior Publication Data

US 2016/0276223 A1    Sep. 22, 2016

(30) Foreign Application Priority Data

Mar. 16, 2015 (DE) .......................... 10 2015 204 698

(51) Int. Cl.
*H01L 21/78* (2006.01)
*H01L 21/683* (2006.01)

(52) U.S. Cl.
CPC .......... *H01L 21/78* (2013.01); *H01L 21/6835* (2013.01); *H01L 21/6836* (2013.01); *H01L 2221/6834* (2013.01); *H01L 2221/68327* (2013.01); *H01L 2221/68381* (2013.01)

(58) Field of Classification Search
CPC ............... H01L 21/78; H01L 21/02013; H01L 21/6835; H01L 21/6836; H01L 2221/68327; H01L 2221/68386
See application file for complete search history.

(56) References Cited

U.S. PATENT DOCUMENTS

| | | | |
|---|---|---|---|
| 6,946,311 B2 * | 9/2005 | Kawashima ...... | H01L 21/67132 438/113 |
| 7,977,213 B1 * | 7/2011 | Hooper ........... | H01L 21/78 257/E21.238 |
| 8,912,048 B2 * | 12/2014 | Kim .............. | H01L 21/78 438/113 |
| 9,209,047 B1 * | 12/2015 | Hackler, Sr. ......... | H01L 21/78 |
| 9,385,040 B2 * | 7/2016 | Tsai .............. | H01L 21/78 |

(Continued)

FOREIGN PATENT DOCUMENTS

| | | |
|---|---|---|
| DE | 10 2006 025 162 B3 | 1/2008 |
| JP | 2003-163313 | 6/2003 |

(Continued)

OTHER PUBLICATIONS

Office Action issued by the Patent Office of Japan for corresponding JP Application No. 2016-030094, dated Jan. 24, 2017.

*Primary Examiner* — Charles D Garber
*Assistant Examiner* — S M Sohel Imtiaz
(74) *Attorney, Agent, or Firm* — Greer Burns & Crain Ltd.

(57) ABSTRACT

A wafer having a device area on one side with a plurality of devices partitioned by division lines is divided into dies. An adhesive tape for protecting devices is attached to the one side of the wafer, the adhesive tape adhering to at least some, optionally all, of the devices. A carrier for supporting the tape is attached to the side of the tape opposite to the one side by an attachment means provided over an entire surface area of the adhesive tape which is in contact with the carrier. The wafer is cut along the division lines. The side of the wafer opposite to the one side is mechanically partially cut, and a remaining part of the cuts in the wafer is mechanically cut and/or cut by laser and/or cut by plasma from the side of the wafer opposite to the one side.

18 Claims, 3 Drawing Sheets

(56) References Cited

U.S. PATENT DOCUMENTS

| | | | |
|---|---|---|---|
| 2002/0042189 A1* | 4/2002 | Tanaka | H01L 21/2007 438/450 |
| 2005/0221598 A1* | 10/2005 | Lu | H01L 24/13 438/613 |
| 2005/0274702 A1* | 12/2005 | Deshi | B23K 26/40 219/121.72 |
| 2006/0276010 A1* | 12/2006 | Bradl | H01L 21/6704 438/464 |
| 2007/0155131 A1 | 7/2007 | Contes | |
| 2007/0212986 A1* | 9/2007 | Priewasser | B24B 7/228 451/41 |
| 2008/0003780 A1 | 1/2008 | Sun et al. | |
| 2008/0138962 A1* | 6/2008 | Sato | H01L 21/78 438/465 |
| 2008/0277806 A1 | 11/2008 | Chen et al. | |
| 2009/0189279 A1* | 7/2009 | How | H01L 24/12 257/737 |
| 2010/0081235 A1* | 4/2010 | Furumura | G06K 19/07749 438/113 |
| 2010/0129989 A1* | 5/2010 | Kamiya | B32B 7/12 438/464 |
| 2010/0311227 A1 | 12/2010 | Hatakeyama et al. | |
| 2011/0256668 A1* | 10/2011 | Urano | H01L 24/03 438/114 |
| 2011/0298156 A1* | 12/2011 | Hooper | H01L 24/29 264/400 |
| 2012/0018854 A1* | 1/2012 | Kato | H01L 21/67092 257/622 |
| 2012/0286429 A1* | 11/2012 | Han | H01L 21/78 257/774 |
| 2013/0267076 A1 | 10/2013 | Lei et al. | |
| 2014/0065768 A1* | 3/2014 | Menath | H01L 21/78 438/113 |

FOREIGN PATENT DOCUMENTS

| | | |
|---|---|---|
| JP | 2005-302982 | 10/2005 |
| JP | 2007-134454 | 5/2007 |
| JP | 2008-159985 | 7/2008 |
| JP | 2013-235940 | 11/2013 |
| JP | 2014-165246 | 9/2014 |
| JP | 2015-041687 | 3/2015 |

* cited by examiner

METHOD OF DIVIDING WAFER

TECHNICAL FIELD

The present invention relates to a method of dividing a wafer, such as a semiconductor wafer, having on one side a device area with a plurality of devices partitioned by a plurality of division lines, into dies.

TECHNICAL BACKGROUND

In a semiconductor device fabrication process, a wafer having a device area with a plurality of devices partitioned by a plurality of division lines is divided into individual dies. This fabrication process generally comprises a cutting step of cutting the wafer along the division lines to obtain the individual dies. In order to protect the devices formed on the wafer during this fabrication process and to suitably position the individual dies, an adhesive tape can be attached to the side of the wafer having the devices formed thereon.

In known semiconductor device fabrication processes, the cutting step referred to above is performed from the front side of the wafer on which the devices are formed. In this cutting process, a surface layer, such as a low-k layer (i.e., a layer with low dielectric constant), formed on the wafer front side is first removed along the division lines by laser grooving. Subsequently, the wafer is fully cut along the resulting laser grooves by blade dicing from the front side of the wafer.

The grooves formed by this laser grooving process need to have a sufficient width for allowing the cutting blade to safely pass therethrough in the subsequent blade dicing step without damaging the remaining surface layer. Hence, the laser groove width is chosen to be significantly larger than the cutting width in the blade dicing process. This requirement of a relatively large laser groove width results in a wider spacing between neighbouring devices and thus limits the number of devices which can be arranged on the wafer, i.e., the packing density. Further, multiple laser passes are necessary to provide such a wide laser groove, thereby rendering the laser grooving process time-consuming and inefficient.

Therefore, the throughput of processed devices per hour is reduced and the productivity is lowered.

Moreover, due to the heat generated in the laser grooving process, the remainder of the surface layer, such as the low-k layer, formed on the front side of the wafer may at least partly delaminate, causing damage to the devices and/or the wafer substrate. Such damage may not only affect the functionality of the devices but also reduce the die strength of the resulting device chips.

Hence, there remains a need for a time- and cost-efficient wafer dividing method which allows for any risk of damage to the wafer to be minimised.

SUMMARY OF THE INVENTION

Accordingly, it is an object of the present invention to provide a time- and cost-efficient method of dividing a wafer into dies which allows for any risk of damage to the wafer to be minimised. This goal is achieved by a wafer dividing method with the technical features of claim 1. Preferred embodiments of the invention follow from the dependent claims.

The invention provides a method of dividing a wafer, having on one side a device area with a plurality of devices partitioned by a plurality of division lines, into dies. The method comprises attaching an adhesive tape for protecting devices on the wafer to the one side of the wafer, the adhesive tape adhering to at least some, optionally all, of the devices, and attaching a carrier for supporting the adhesive tape to the side of the adhesive tape being opposite to the side in contact with devices by an attachment means. The attachment means is provided over an entire surface area of the adhesive tape which is in contact with the carrier. The method further comprises cutting the wafer along the division lines, wherein the side of the wafer being opposite to the one side is mechanically partially cut, and a remaining part of the wafer, in the thickness direction thereof in the region or regions where the partial cut or cuts had been formed, is mechanically cut and/or cut by laser and/or cut by plasma from the side of the wafer being opposite to the one side.

In the step of mechanically partially cutting the side of the wafer being opposite to the one side, the side of the wafer being opposite to the one side is mechanically partially cut in the thickness direction of the wafer, i.e., along part of the thickness of the wafer.

According to the wafer dividing method of the present invention, the wafer is cut along the division lines from the side of the wafer being opposite to the one side, i.e., from the backside of the wafer on which the devices are not formed. Specifically, the wafer backside is mechanically partially cut and a remaining part of the wafer is mechanically cut and/or cut by laser and/or cut by plasma from the backside.

Hence, no laser grooving on the wafer front side with a groove width which is larger than the cutting width in the mechanical cutting process is required. Therefore, the spacing between adjacent devices in the device area can be reduced, thus increasing the number of devices which can be arranged on the wafer, resulting in an improved packing density.

Thus, the throughput of processed devices per hour can be increased and the productivity can be enhanced, so that a time and cost-efficient wafer dividing method is achieved.

Also, since the wafer is cut along the division lines from the backside thereof, no damage to the wafer front side, such as delamination of a surface layer (e.g., a low-k layer) formed thereon, occurs. Hence, any damage to the devices and/or the wafer substrate can be reliably prevented, allowing for robust device chips with a high die strength to be obtained.

Moreover, if the remaining part of the wafer is cut by laser, the number of laser passes can be significantly reduced, since no laser grooving on the wafer front side with a large groove width is necessary. Thus, the efficiency of the wafer dividing method is further improved.

The remaining part of the wafer may be cut in a single mechanical cutting step, e.g., by blade dicing or sawing, or in a single laser cutting step or in a single plasma cutting step, e.g., by using a plasma source. The remaining part of the wafer may be cut by a sequence of mechanical cutting and/or laser cutting and/or plasma cutting steps. For example, a mechanical cutting step may be followed by a laser cutting step or a plasma cutting step.

In the step of mechanically partially cutting the side of the wafer being opposite to the one side, the wafer may be cut along 50% or more, preferably along 70% or more, more preferably along 50% or more and even more preferably along 90% or more, of its thickness.

The side of the wafer being opposite to the one side may be mechanically partially cut with a first cutting width, and the remaining part of the wafer, in the thickness direction thereof in the region or regions where the partial cut or cuts had been formed, may be mechanically cut and/or cut by laser and/or cut by plasma from the side of the wafer being opposite to the one side with a second cutting width, wherein the second cutting width is smaller than or equal to the first cutting width.

In a particularly preferred embodiment of the method of the invention, the second cutting width is smaller than the first cutting width.

As has been detailed above, the wafer is cut along the division lines from the backside of the wafer on which the devices are not formed. Therefore, the first cutting width in the step of mechanically partially cutting the wafer backside does not affect the required spacing of the devices which are formed on the opposite side of the wafer, i.e., the front side thereof.

Further, in the method according to this preferred embodiment, a remaining part of the wafer in the thickness direction thereof is cut with a second cutting width which is smaller than the first cutting width. Hence, the device area on the one side, i.e., the front side, of the wafer is cut from the wafer backside with a reduced cutting width. The method of this preferred embodiment of the invention thus allows for the spacing between neighbouring devices in the device area to be further reduced, resulting in an additional increase of the packing density of the devices.

In this way, the throughput of processed devices per hour and the productivity can be further enhanced.

Also, if the remaining part of the wafer is cut by laser, the number of laser passes can be further reduced, due to the reduced second cutting width, thus further improving the efficiency of the wafer dividing method. In particular, in this case, a single laser pass is sufficient for the cutting process.

The wafer may be, for example, a semiconductor wafer, a glass wafer, a sapphire wafer, a ceramic wafer, such as an alumina ($Al_2O_3$) ceramic wafer, a quartz wafer, a zirconia wafer, a PZT (lead zirconate titanate) wafer, a polycarbonate wafer, a metal (e.g., copper, iron, stainless steel, aluminium or the like) or metalised material wafer, a ferrite wafer, an optical crystal material wafer, a resin, e.g., epoxy resin, coated or molded wafer or the like.

In particular, the wafer may be, for example, a Si wafer, a GaAs wafer, a GaN wafer, a GaP wafer, an TnAs wafer, an InP wafer, a SIC wafer, a SiN wafer, a LT (lithium tantalate) wafer, a IN (lithium niobate) wafer or the like.

The wafer may be made of a single material or of a combination of different materials, e.g., two or more of the above-identified materials. For example, the wafer may be a Si and glass bonded wafer, in which a wafer element made of Si is bonded to a wafer element made of glass.

The wafer may have on the one side a peripheral marginal area with no devices formed around the device area.

The method of the invention may further comprise grinding the side of the wafer being opposite to the one side for adjusting the wafer thickness.

The grinding of the wafer may be performed before cutting of the wafer. In this case, the wafer has a reduced thickness when the cutting process is performed, shortening the duration of the cutting step and thus further enhancing the productivity.

The cutting of the wafer may be performed before grinding of the wafer. This approach allows for the cutting process to be performed at a time when the wafer still exhibits a larger thickness. Accordingly, a warping of the wafer and/or a breaking out of the cut can be particularly reliably prevented, resulting in a further increase of the processing quality.

The adhesive tape may be formed of a flexible or pliable material. In this case, the tape can deform so as to conform to the devices formed in the device area in a reliable manner, enabling a particularly thin grinding of the wafer in the grinding step.

The adhesive tape may be heat resistant and/or plasma resistant and/or moisture resistant. In this way, it can be ensured that the tape is not damaged in following process steps, such as heat curing or plasma etching, thus providing particularly efficient protection for the devices in the device area.

The adhesive of the adhesive tape on the side thereof which is in contact with the devices may be curable by an external stimulus, such as heat, UV radiation, an electric field and/or a chemical agent. In this way, the adhesive tape can be easily removed from the wafer after processing. The external stimulus may be applied to the adhesive of the adhesive tape on the side thereof which is in contact with the devices so as to lower the adhesive force of the adhesive, thus allowing for an easy removal of the adhesive tape.

In particular, the adhesive may be a heat curable adhesive with a curing temperature from 80 to 220° C., preferably from 100 to 200° C., more preferably from 120 to 190° C. and even more preferably from 150 to 180° C. Still even more preferably, the curing temperature is 1700° C.

The adhesive may be an acrylic resin or an epoxy resin. A preferred example of a UV curable type resin for the adhesive is, e.g., urethane acrylate oligomer.

Further, the adhesive may be, for example, a water soluble resin.

The adhesive tape may be a double sided adhesive tape, i.e., an adhesive tape with adhesives applied to both sides thereof. In this case, the attachment means may be an adhesive applied to the side of the adhesive tape being opposite to the side in contact with the devices, i.e., the side of the adhesive tape which faces the carrier.

The same adhesive may be applied to the two sides of the double sided adhesive tape. Alternatively, different adhesives may be applied to the two sides of the double sided adhesive tape. In particular, an adhesive which is curable by an external stimulus, such as a heat curable adhesive, may be applied to the side of the adhesive tape which is in contact with the devices, while a non-curable adhesive may be applied to the side of the adhesive tape which faces the carrier.

For example, in the method of the invention, the Revalpha tape manufactured by the Nitto Denko Corporation may be used as the adhesive tape.

The attachment means may be an adhesive layer formed of an adhesive material. The adhesive material may be curable by an external stimulus, such as heat, UV radiation, an electric field and/or a chemical agent. In this way, the carrier can be easily removed from the adhesive tape after processing. The external stimulus may be applied to the adhesive material so as to lower the adhesive force of the material, thus allowing for an easy removal of the carrier.

In particular, the adhesive material may be a heat curable adhesive material with a curing temperature from 80 to 220° C., preferably from 100 to 200° C., more preferably from 120 to 190° C. and even more preferably from 150 to 180° C. Still even more preferably, the curing temperature is 170° C.

The adhesive material may be an acrylic resin or an epoxy resin. A preferred example of a UV curable type resin for the adhesive material is, e.g., urethane acrylate oligomer.

Further, the adhesive material may be, for example, a water soluble resin.

The attachment means may have a thickness in the range of 5 to 100 μm.

A surface layer, in particular, a low-k layer, i.e., a layer with a low dielectric constant, may be provided on the one side of the wafer. The surface layer, in particular, the low-k layer, may be mechanically cut and/or cut by laser and/or cut by plasma from the side of the wafer being opposite to the one side.

As has been detailed above, since the wafer is cut along the division lines from the backside thereof, no delamination of the surface layer formed thereon occurs. Hence, any damage to the devices and/or the wafer substrate can be reliably prevented, allowing for robust device chips with high die strength to be obtained.

The wafer dividing method of the invention can be particularly advantageously used for a wafer having a low-k layer provided on its front side. Low-k layers are generally very brittle and are easily damaged and/or delaminated when cutting the wafer from the front side thereof. However, when dividing such a wafer using the method of the invention, no such damage and/or delamination occurs.

The wafer dividing method of the invention may further comprise applying plasma etching to the side of the wafer being opposite to the one side after cutting the wafer. In this way, any mechanical damage caused in the wafer by the cutting process can be removed, thus relieving mechanical stress generated in the wafer during cutting thereof and enhancing the die strength of the resulting device chips.

A protective layer may be applied to the side of the wafer being opposite to the one side before plasma etching. In this way, the protective layer serves as a mask during plasma etching, protecting the wafer backside from the plasma and efficiently guiding the plasma into the cuts between the dies created in the cutting process, thus reliably etching the side surfaces of the dies.

The wafer dividing method of the invention may further comprise attaching an adhesive pick-up tape to the side of the wafer being opposite to the one side after cutting the wafer.

This step allows for a particularly easy detachment of the carrier from the adhesive tape and the adhesive tape from the one side of the wafer since the dies are held by the adhesive pick-up tape.

The adhesive pick-up tape may further be configured to be radially expandable or stretchable. The method may further comprise a step of radially expanding the adhesive pick-up tape, e.g., by use of an expansion drum, to increase the distances between dies and allowing an easier die pick-up.

Alternatively, the dies may be picked up directly from the adhesive tape, e.g., after applying an external stimulus, such as heat, to the adhesive tape, thereby curing the adhesive on the side of the adhesive tape which is in contact with the devices.

The wafer dividing method of the invention may further comprise parallelizing the surface of the adhesive tape opposite the surface contacting the devices with the surface of the wafer opposite the one side. In this way, a higher processing precision, also leading to an increased processing quality, can be achieved.

The carrier may be made of a rigid material, such as silicon and/or glass and/or SUS. If the carrier is made of glass, energy input into the attachment means is possible with radiation that is transmittable through glass, for instance UV radiation. If the carrier is made of silicon or SUS, a cost-efficient carrier is provided. Also a combination of these materials is possible.

BRIEF DESCRIPTION OF THE DRAWINGS

Hereinafter, non-limiting examples of the invention are explained with reference to the drawings, in which.

DETAILED DESCRIPTION OF PREFERRED EMBODIMENT

A preferred embodiment of the present invention will now be described with reference to the accompanying drawings. The preferred embodiment relates to a method for dividing a wafer W into dies.

The wafer W can be, for example, a MEMS wafer having MEMS devices formed on a front side surface thereof, which is called a pattern side 1 in the following description. However, the wafer W is not limited to a MEMS wafer, but may also be a CMOS wafer having CMOS devices, preferably as solid-state imaging devices, formed on the pattern side 1 thereof or a wafer with other types of devices on the pattern side 1.

The wafer W may be made of a semiconductor, e.g., silicon. Such a silicon wafer W can include devices such as ICs (integrated circuits) and LSIs (large scale integrations) on a silicon substrate. Alternatively, the wafer may be an optical device wafer configured by forming optical devices such as LEDs (light emitting diodes) on an inorganic material substrate of, for example, ceramic, glass or sapphire. The wafer W is not limited to this and can be formed in any other way. Furthermore, also a combination of the above described exemplary wafer designs is possible.

The wafer W can have a thickness before grinding in the μm range, preferably in the range of 625 to 925 μm.

The wafer W preferably exhibits a circular shape. The wafer W is provided with a plurality of crossing division lines (not shown), called streets, formed on the pattern side 1 thereof, thereby partitioning the wafer W into a plurality of rectangular regions where devices, such as those described previously, are respectively formed. These devices are formed in a device area 2 of the wafer W. In the case of a circular wafer W, this device area 2 is preferably circular and arranged concentrically with the outer circumference of the wafer W. Inc device area 2 is surrounded by an annular peripheral marginal area 3 surrounding the device area 2. In this peripheral marginal area 3, no devices are formed. The peripheral marginal area 3 is preferably arranged concentrically to the device area 2 and/or the outer circumference of the wafer W. The radial extension of the peripheral marginal area 3 can be in the mm range and preferably ranges from 1 to 3 mm.

The pattern side 1 of the wafer W can be further provided with fragile structures or bumps (not shown) for establishing an electrical contact with the devices of the device area 2 in the separated dies.

In the following, the method of dividing the wafer W according to the preferred embodiment of the present invention will be described with reference to FIGS. 1 to 10.

Figure 1:
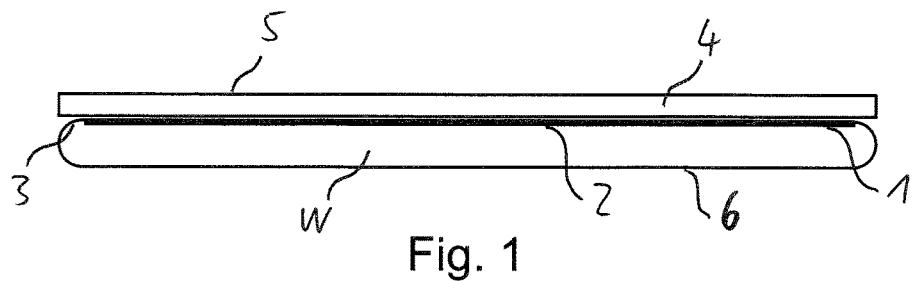
FIG. 1 is a cross-sectional view illustrating a first step of a method of dividing a wafer according to an embodiment of the present invention.

FIG. 1 depicts the outcome of a first step of the method of dividing a wafer according to the embodiment of the present invention. In this first step, an adhesive tape 4 is attached to the pattern side 1 of the wafer W. In other words, the pattern side 1 is laminated with the adhesive tape 4. The adhesive tape 4 preferably has the same shape as the wafer W and is attached thereto concentrically. When attached to the wafer W, the adhesive tape 4 adheres to the devices formed in the device area 2 of the pattern side 1. The adhesive tape 4 allows for protection of the devices formed in the device area 2 of the wafer W.

The adhesive of the adhesive tape 4 on the side thereof which is in contact with the devices formed in the device area 2 of the pattern side 1 may be curable by an external stimulus, such as heat, UV radiation, an electric field and/or a chemical agent. In this way, the adhesive tape 4 can be easily removed from the wafer U after processing.

In particular, an adhesive which is curable by an external stimulus, such as a heat curable adhesive, may be applied to the side of the adhesive tape which is in contact with the devices. For example, the Revalpha tape manufactured by the Nitto Denko Corporation may be used as the adhesive tape, wherein the side of the tape having a heat curable adhesive applied thereto is arranged so as to be in contact with the devices of the device area 2.

Further, the adhesive of the adhesive tape 4 may be an acrylic resin or an epoxy resin. A preferred example of a UV curable type resin for the adhesive is, e.g., urethane acrylate oligomer. Moreover, the adhesive may be, for example, a water soluble resin.

Figure 2:
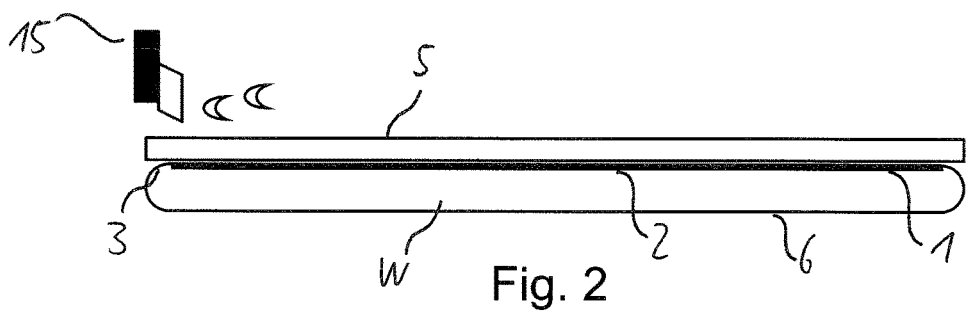
FIG. 2 is a cross-sectional view illustrating a second step of the method of dividing a wafer according to the embodiment of the present invention.

FIG. 2 illustrates a second step of the method of dividing a wafer according to the embodiment of the present invention. It is to be noted that this second step is optional for the method according to this embodiment.

In this second step, the surface of the adhesive tape 4 which is oriented away from the wafer W is parallelized to the surface of the wafer W which is oriented away from the adhesive tape 4. Due to the fact that the devices are formed on the pattern side 1 of wafer W, the top surface 5 of the adhesive tape 4 might exhibit an uneven surface profile due to the devices formed below it. The distance between the lowest point of this top surface 5, which is the point of the surface that is closest to the wafer W, and the highest point of this top surface 5, which is the point that is the most far away from the wafer W, can be around 70 μm. Through the parallelization in this second step, this distance can be, for example, reduced to approximately 2 μm.

This parallelization can be preferably achieved by chucking the wafer W on a chuck table (not shown) and moving a milling device 15 along the top surface 5 such that the machining plane of the milling device 15 is oriented in parallel to the backside surface 6 of wafer W. The total thickness value of the wafer W with the laminated adhesive tape 4 can be significantly improved by this second step.

Figure 3:
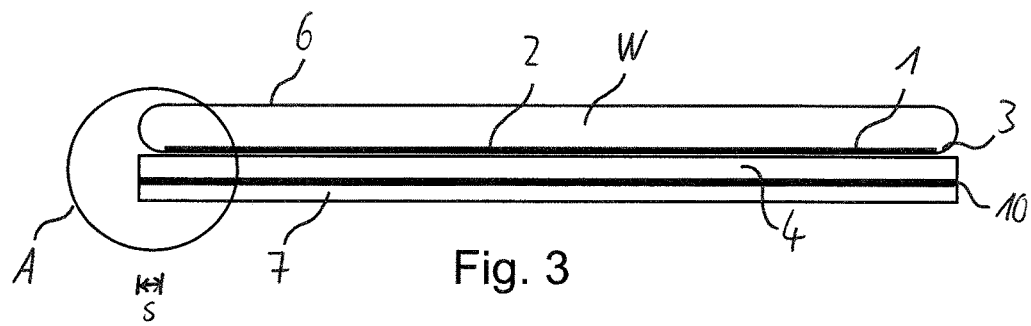
FIG. 3 is a cross-sectional view illustrating third and fourth steps of the method of dividing a wafer according to the embodiment of the present invention.
Figure 4:
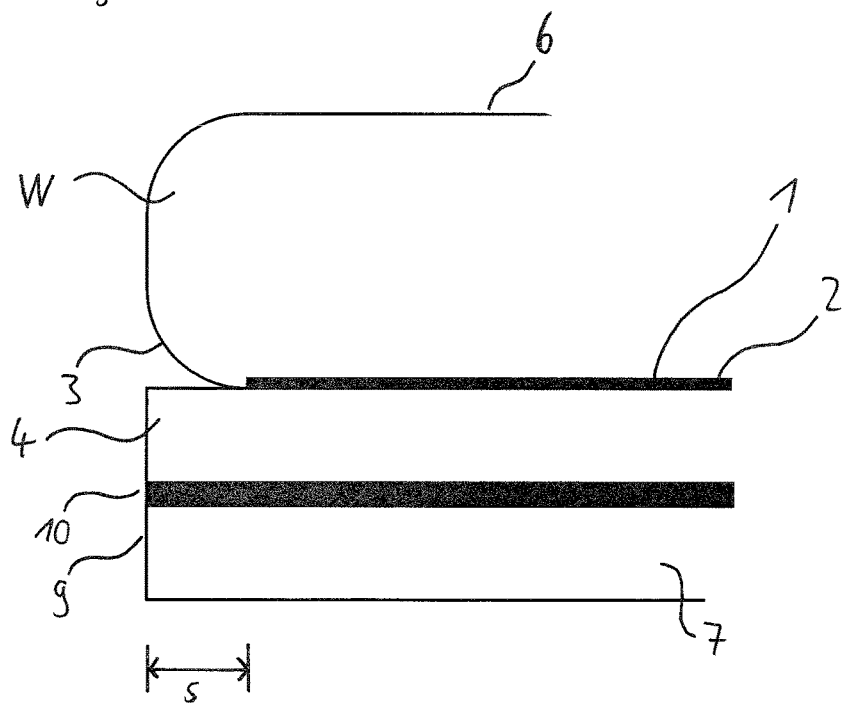
FIG. 4 is an enlarged view of the region A in FIG. 3.

FIGS. 3 and 4 show the outcome of third and fourth steps of the method of dividing a wafer according to this embodiment, wherein. FIG. 4 is an enlarged view of the region A in FIG. 3.

In the third step, a hard carrier 7 is provided. The hard carrier 7 is preferably made of a material that is significantly harder and more rigid than the material of the adhesive tape 4. The hard carrier 7 is for instance made of silicon, glass, SUS or a combination thereof. Preferably, the hard carrier 7 is formed congruently with and is arranged concentrically to the adhesive tape 4, as is illustrated in FIGS. 3 and 4. The hard carrier 7 may, for example, exhibit a height of 500 to 1000 μm.

The hard carrier 7 exhibits an outer annular portion s, which extends from the outer circumference 9 of the carrier 7 radially inward. The annular portion s corresponds to the peripheral marginal area 3 of the wafer W, when the hard carrier 7 is attached concentrically to the adhesive tape 4.

In the fourth step of this embodiment, the hard carrier 7 is concentrically attached to the top surface 5 of the adhesive tape 4. Due to the fact that hard carrier 7 and adhesive tape 4 are formed congruently, these two parts form a continuous circumferential surface. The attachment of hard carrier 7 to adhesive tape 4 is achieved by an attachment means 10, which allows for a later detachment of hard carrier 7 from adhesive tape 4 without damage to the hard carrier 7. The attachment means 10 is provided over the entire surface area of the adhesive tape 4 which is in contact with the carrier 7, as is schematically shown in FIG. 3.

The attachment means 10 can exhibit adhesive characteristics that can be influenced by the application of energy, for instance heat or UV-radiation. The attachment means 10 can comprise heat curable or UV-curable glue, preferably in form of a double-sided adhesive tape.

Alternatively, the attachment means 10 may be a non-curable adhesive.

As has been detailed above, the Revalpha tape manufactured by the Nitto Denko Corporation may be used as the adhesive tape. In this case, the attachment means 10 may be formed by the adhesive provided on the side of the Revalpha tape which is opposite the side of the tape which has the heat curable adhesive applied thereto.

The wafer W, the adhesive tape 4 and the hard carrier 7 after this fourth step form a unit with constant, or approximately constant, diameter. This unit, and especially the adhesive tape 4, is structurally supported by the rigid hard carrier 7, which is attached to the adhesive tape 4 by means of the attachment means 10.

If UV-curable glue is used for the attachment means 10, the hard carrier 7 is preferably made of glass. This allows UV-radiation to penetrate through the carrier 7 to cure the glue, such that the glue loses its adhesive characteristics and the carrier 7 can be easily detached without being damaged.

Alternatively, instead of the UV-curable glue, a heat-curable adhesive tape, preferably a double-sided adhesive tape, can be used for the attachment means 10 for attaching the hard carrier 7 to the adhesive tape 4. Such a heat-curable adhesive tape allows for an easy detachment of the hard carrier 7 from the adhesive tape 4 by applying heat to the heat-curable adhesive tape without damaging the carrier 7. This configuration allows for the use of silicon or SUS as a material for the hard carrier 7 since no transparency thereof is needed. Alternatively, water-soluble glue can be used for the attachment means 10.

It is also possible that dispensed liquid glue is used for the attachment means 10. The liquid glue will dry and connect the adhesive tape 4 and the hard carrier 7 to each other.

To detach the hard carrier 7 from the adhesive tape 4, a knife or any other mechanical cutting devices can be used for cutting the attachment means 10 to detach the hard carrier 7 from the adhesive tape 4 without damage. Alternatively, a glue, such as a liquid glue, used for the attachment means 10 may be curable by an external stimulus, such as UV radiation or heat. In this case, the hard carrier 7 can be detached from the adhesive tape 4 by applying the external stimulus to the glue, thereby curing the glue and thus lowering its adhesive force, and subsequently removing the hard carrier 7 from the adhesive tape 4. Further, the glue, such as a liquid glue, may be a water soluble glue, allowing for the hard carrier 7 to be removed from the adhesive tape 4 by applying water to the glue.

Figure 5:
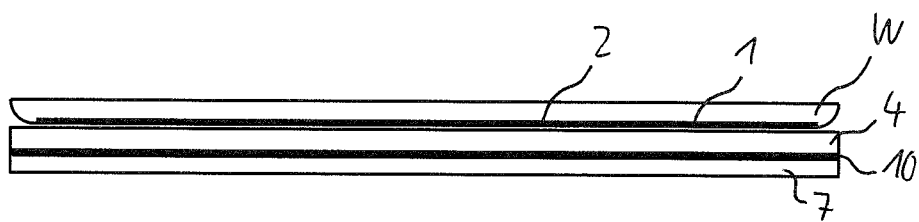
FIG. 5 is a cross-sectional view illustrating a fifth step of the method of dividing a wafer according to the embodiment of the present invention.

FIG. 5 illustrates the outcome of a fifth step of this embodiment. In this fifth step, the wafer W, to which the adhesive tape 4 has been attached, wherein the hard carrier 7 is mounted to the adhesive tape 4, is ground from its backside surface 6 with a grinding device (not shown) to a desired thickness. In this embodiment, the thickness after grinding is the final thickness of the dies. Such a grinding device can include one or more grinding wheels, such as diamond wheels.

Figure 6:
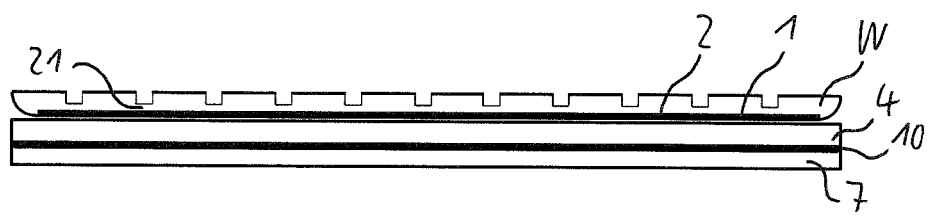
FIG. 6 is a cross-sectional view illustrating a sixth step of the method of dividing a wafer according to the embodiment of the present invention.
Figure 7:
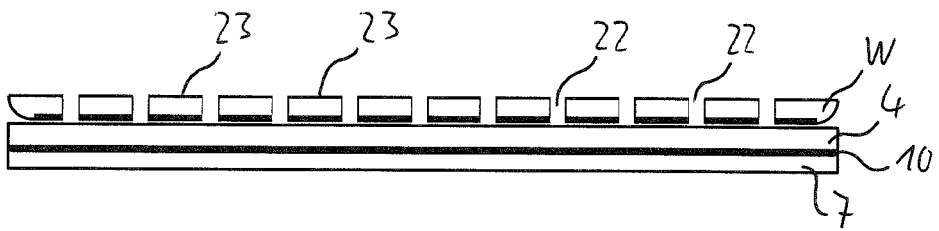
FIG. 7 is a cross-sectional view illustrating a seventh step of the method of dividing a wafer according to the embodiment of the present invention.
Figure 8:
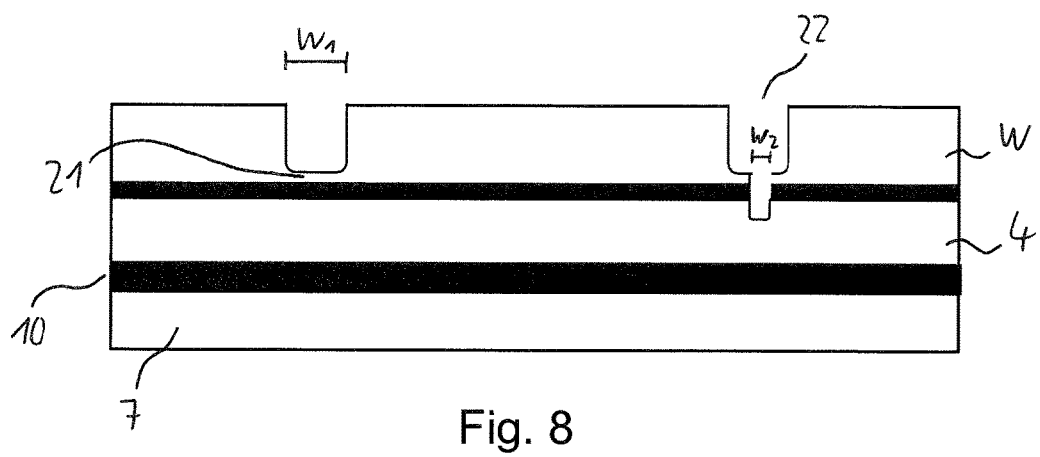
FIG. 8 is a cross-sectional view further illustrating the sixth and seventh steps of the method of dividing a wafer according to the embodiment of the present invention.

In sixth and seventh steps of the wafer dividing method of the preferred embodiment, the wafer W is cut along the division lines from the ground backside thereof, as is illustrated in FIGS. 6 to 8. FIG. 8 shows an enlarged view of a part of the unit consisting of the wafer W, the adhesive tape 4 and the hard carrier 7, wherein the left-hand side of FIG. 8 schematically shows a partial cut and the right-hand side of FIG. 8 schematically shows a cut 22 reaching through the entire thickness of the wafer W.

Specifically, the ground backside of the wafer W is first mechanically partially cut with a first cutting width $w_1$ (see FIG. 6 and the left-hand side of FIG. 8) in the sixth step using a mechanical cutting device, such as a blade or a saw (not shown), e.g., a dicing blade. As is schematically shown in FIG. 8, the wafer W is mechanically cut along more than 80% of its thickness. The mechanical cut is performed along the division lines arranged on the wafer W.

Subsequently, in this embodiment, a remaining part 21 of the wafer H, in the thickness direction thereof in the regions where the partial cuts had been formed, is preferably cut by laser from the backside of the wafer VI with a second cutting width $w_2$ (see FIG. 7 and the right-hand side of FIG. 8) in the seventh step. The remaining part 21 of the wafer H may be cut by laser ablation. However, alternatively, the remaining part 21 of the wafer W may be mechanically cut, for example, by using a mechanical cutting device, such as a blade or a saw, with a width which is smaller than that of the mechanical cutting device used for the partial cuts. Moreover, as a further alternative, the remaining part 21 of the wafer H may be cut by plasma, e.g., by using a plasma source. Further, also combinations of these different cutting methods may be used.

As is shown in FIG. 8, the second cutting width $w_2$ is smaller than the first cutting width $w_1$. For the sake of simplicity, this difference between the two cutting widths is not illustrated in FIGS. 6 and 7.

By cutting the remaining part 21 of the wafer W, the dies 23 are fully separated from each other.

The method of the invention is especially advantageous if the wafer H exhibits a surface layer (not shown), in particular, a low-k layer, on its pattern side 1. Low-k layers are generally very brittle and are easily damaged and/or delaminated when cutting the wafer W from the pattern side 1 thereof. However, when dividing such a wafer W using the method of the invention, no such damage and/or delamination occurs, since the wafer W is cut from the backside thereof in the manner specified above.

After the dies 23 have been completely separated from one another, they respectively adhere to the adhesive tape 4, to which the hard carrier 7 is attached, as is illustrated in FIG. 7.

In an optional further step of the embodiment, plasma etching may be applied to the wafer backside after cutting the wafer W. In this way, any mechanical damage caused in the wafer W by the cutting process can be removed, thus relieving mechanical stress generated in the wafer W during cutting thereof and enhancing the die strength of the resulting device chips.

Figure 9:
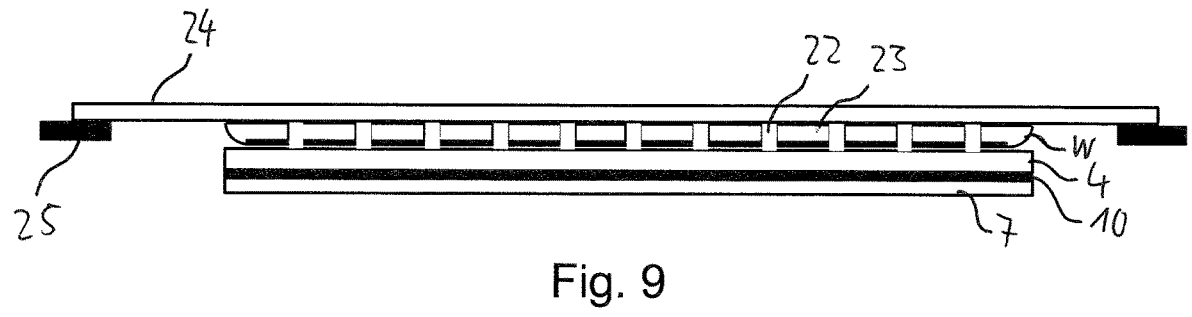
FIG. 9 is a cross-sectional view illustrating an eighth step of the method of dividing a wafer according to the embodiment of the present invention.

In an eighth step of the embodiment, the outcome thereof being shown in FIG. 9, the individual dies 23, respectively held by the adhesive tape 4 and the hard carrier 7, are placed on an adhesive pick-up tape 24 mounted on an annular frame 25. The unit of dies 23, adhesive tape 4 and hard carrier 7 is placed on the adhesive pick-up tape 24 in such a way that the ground surface of the dies 23 contacts the adhesive pick-up tape 24, as is shown in FIG. 9.

Figure 10:
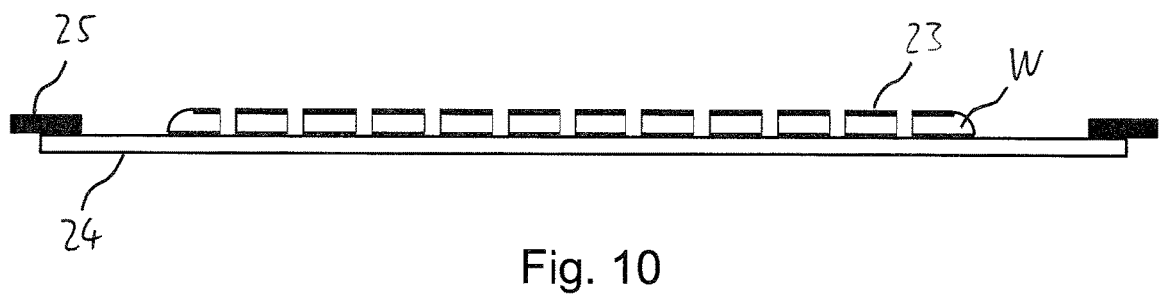
FIG. 10 is a cross-sectional view illustrating a ninth step of the method of dividing a wafer according to the embodiment of the present invention.

In a ninth step of the embodiment, the result of which is shown in FIG. 10, the carrier 7 and the adhesive tape 4 are removed from the wafer W. In particular, the adhesive of the adhesive tape 4 on the side thereof facing the pattern side 1 of the wafer W may be cured by applying an external stimulus thereto, as has been detailed above, so as to lower the adhesive force of the adhesive, thus allowing for an easy removal of the adhesive tape 4 and the carrier 7 from the wafer W.

Subsequently, the individual separated dies 23 can be picked up from the adhesive pick-up tape 24 by a pick-up device (not shown). The spacing between the individual dies 23 can be increased by radially stretching the pick-up tape 24 in order to facilitate the pick-up process.

Alternatively, the dies 23 may be picked up directly from the adhesive tape 4, e.g., after applying an external stimulus, such as heat, to the adhesive tape 4, thereby curing the adhesive on the side of the adhesive tape 4 which is in contact with the devices.

The invention claimed is:

1. A method of dividing a wafer, having on one side a device area with a plurality of devices partitioned by a plurality of division lines, into dies, the method comprising:
   attaching an adhesive tape for protecting devices on the wafer to the one side of the wafer, the adhesive tape having an adhesive in direct contact with the devices and the adhesive is curable by an external stimulus that hardens the adhesive and lowers the adhesive force of the adhesive;
   attaching a carrier for supporting the adhesive tape to the side of the adhesive tape being opposite to the side in contact with the devices by an attachment means, wherein the attachment means is an adhesive layer provided over an entire surface area of the adhesive tape which is in contact with the carrier, the adhesive layer forming the attachment means being curable by a external stimulus that lowers the adhesive force of the adhesive layer; and
   cutting the wafer along the division lines; wherein:
      the side of the wafer being opposite to the one side is mechanically partially cut, thereby forming a partial cut or partial cuts extending from the side being opposite to the one side to an area separated from the devices, to thereby define a remaining part, wherein said partial cut or each of said partial cuts extends to reach at least 50% of the thickness of the wafer; and the remaining part of the wafer, in the thickness direction thereof in the region or regions where the partial cut or cuts had been formed, is mechanically cut and/or cut by laser and/or cut by plasma from the side of the wafer being opposite to the one side.

2. The method according to claim 1, further comprising grinding the side of the wafer being opposite to the one side for adjusting the wafer thickness.

3. The method according to claim 2, wherein the grinding of the wafer is performed before cutting of the wafer.

4. The method according to claim 2, wherein the cutting of the wafer is performed before grinding of the wafer.

5. The method according to claim 1, wherein a low-k layer is provided on the one side of the wafer and the low-k layer is mechanically cut and/or cut by laser and/or cut by plasma from the side of the wafer being opposite to the one side.

6. The method according to claim 1, wherein the external stimulus includes heat, UV radiation, an electric field and/or a chemical agent.

7. The method according to claim 6, further comprising applying the external stimulus to the adhesive of the adhesive tape in contact with the devices so as to lower the adhesive force of the adhesive.

8. The method according to claim 1, further comprising attaching an adhesive pick up tape to the side of the wafer being opposite to the one side after cutting the wafer.

9. The method according to claim 1, further comprising parallelizing the surface of the adhesive tape opposite the surface contacting the devices with the surface of the wafer opposite the one side.

10. The method according to claim 1, wherein the carrier is made of a rigid material, such as silicon and/or glass and/or SUS.

11. The method according to claim 1, wherein the partial cut or partial cuts is/are formed using a blade or a saw.

12. The method according to claim 11, wherein the remaining part is cut by laser.

13. The method according to claim 11, wherein the remaining part is cut by plasma.

14. The method according to claim 11, wherein the remaining part is cut by a blade that has a width that is smaller than the width of the blade or saw used for forming the partial cut or cuts.

15. The method according to claim 1, wherein a width of the partial cut or cuts is/are wider than that of the cut formed in the remaining part.

16. The method according to claim 1, wherein said partial cut or each of said partial cuts extends to reach at least 70% of the thickness of the wafer.

17. The method according to claim 1, wherein said partial cut or each of said partial cuts extends to reach at least 80% of the thickness of the wafer.

18. The method according to claim 1, wherein said partial cut or each of said partial cuts extends to reach at least 90% of the thickness of the wafer.

* * * * *